(12) United States Patent
Kameda

(10) Patent No.: US 7,932,771 B2
(45) Date of Patent: Apr. 26, 2011

(54) SEMICONDUCTOR DEVICE

(75) Inventor: Tomoyuki Kameda, Tama (JP)

(73) Assignee: Mitsumi Electric Co., Ltd, Tokyo (JP)

( * ) Notice: Subject to any disclaimer, the term of this patent is extended or adjusted under 35 U.S.C. 154(b) by 0 days.

(21) Appl. No.: 12/563,200

(22) Filed: Sep. 21, 2009

(65) Prior Publication Data

US 2010/0102874 A1   Apr. 29, 2010

(30) Foreign Application Priority Data

Oct. 29, 2008   (JP) .................................. 2008-278720

(51) Int. Cl.
G05F 1/10   (2006.01)
(52) U.S. Cl. ........................................ 327/538; 327/530
(58) Field of Classification Search ........................ None
See application file for complete search history.

(56) References Cited

U.S. PATENT DOCUMENTS

| | | | | | |
|---|---|---|---|---|---|
| 5,428,339 | A | * | 6/1995 | Das | 338/195 |
| 5,796,310 | A | * | 8/1998 | Ariyosi et al. | 330/307 |
| 6,229,428 | B1 | * | 5/2001 | Lai | 338/195 |
| 7,087,993 | B2 | * | 8/2006 | Lee | 257/728 |
| 7,145,929 | B2 | * | 12/2006 | Bergmann et al. | 372/38.02 |
| 7,667,316 | B2 | * | 2/2010 | Fukamizu et al. | 257/691 |
| 7,696,786 | B2 | * | 4/2010 | Laulanet et al. | 326/68 |
| 2001/0015490 | A1 | * | 8/2001 | Lee | 257/693 |
| 2006/0134836 | A1 | * | 6/2006 | Knapp et al. | 438/126 |
| 2007/0252213 | A1 | * | 11/2007 | Hirose | 257/360 |
| 2008/0078923 | A1 | * | 4/2008 | Hirose | 250/214.1 |
| 2008/0197461 | A1 | * | 8/2008 | Yu et al. | 257/673 |
| 2010/0019750 | A1 | * | 1/2010 | Chou et al. | 323/284 |

FOREIGN PATENT DOCUMENTS

| | | | |
|---|---|---|---|
| JP | 06216702 A | * | 8/1994 |
| JP | 2004-13359 | * | 1/2004 |
| JP | 2007-318094 | | 12/2007 |

* cited by examiner

*Primary Examiner* — Thomas J Hiltunen
(74) *Attorney, Agent, or Firm* — IPUSA, PLLC

(57) ABSTRACT

A semiconductor device includes a semiconductor element including a current mirror circuit, a parasitic resistance formed at the current mirror circuit, and a connection terminal electrically connected to a part of the current mirror circuit via an electric conductor including a bonding wire, the connection terminal being configured to perform input and output relative to an outside of the semiconductor device; wherein a resistance value of the bonding wire is controlled so that a shift of an output electric current of the current mirror circuit based on the parasitic resistance is corrected.

3 Claims, 6 Drawing Sheets

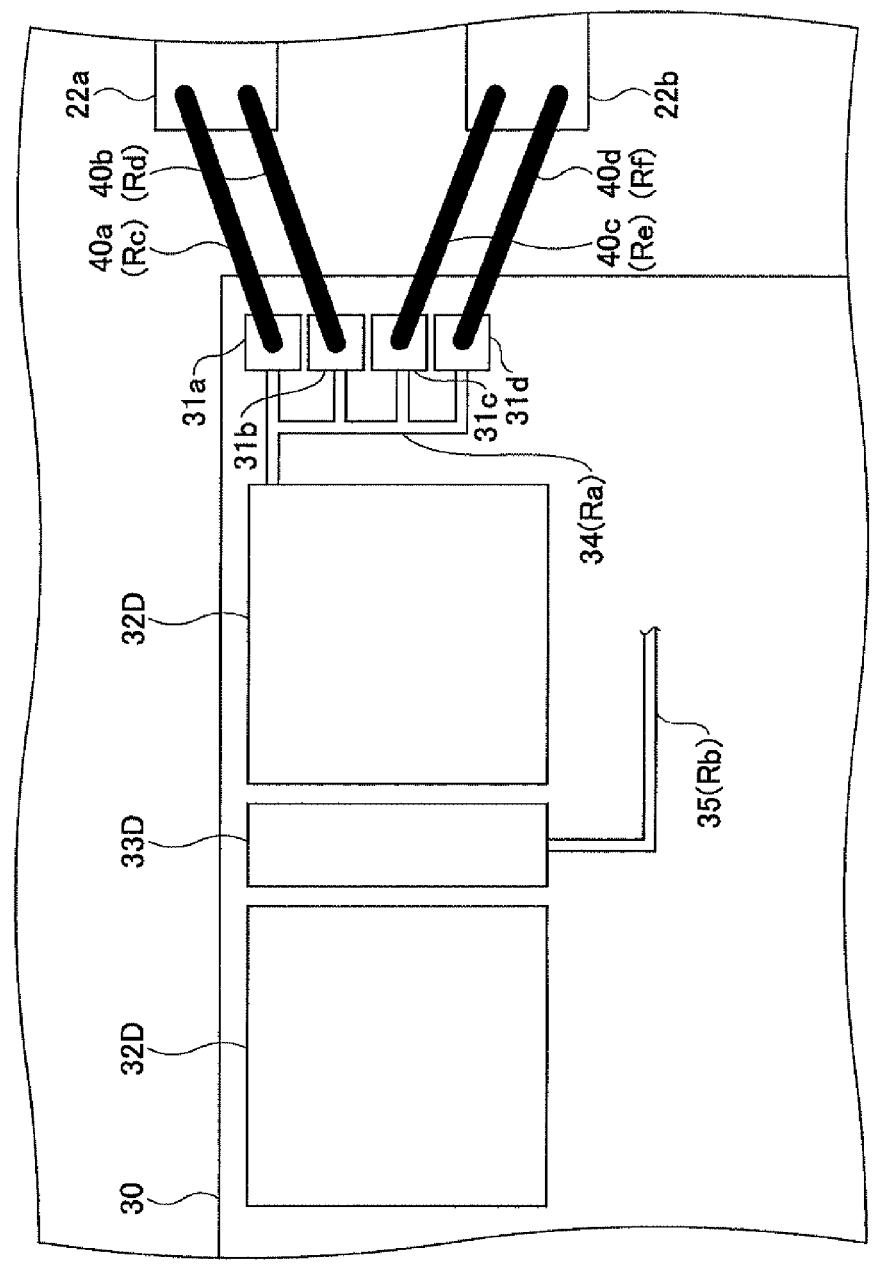

US 7,932,771 B2

SEMICONDUCTOR DEVICE

CROSS-REFERENCE TO RELATED APPLICATIONS

This patent application is based upon and claims the benefit of priority of Japanese Patent Application No. 2008-278720 filed on Oct. 29, 2008 the entire contents of which are incorporated herein by reference.

BACKGROUND OF THE INVENTION

1. Field of the Invention

The present invention generally relates to semiconductor devices. More specifically, the present invention relates to a semiconductor device including a current mirror circuit.

2. Description of the Related Art

Conventionally, current mirror circuits formed by transistors have been used as parts of various circuits. The current mirror circuit includes two transistors. An electric current having a designated rate flows to each of the transistors. In such a current mirror circuit, if there is unevenness in electric characteristics between the transistors, the electric current having the designated rate cannot flow. Because of this, the current mirror circuit is formed by transistors having equal channel lengths and channel widths so that characteristics of the transistors are the same. See, for example, Japanese Laid-Open Patent Application Publication No. 2007-318094.

However, the electric current having the designated rate may not flow by only making the characteristics of the transistors the same. In other words, in the semiconductor device where the current mirror circuit is formed, due to parasitic resistance of a metal wiring or the like connected to the current mirror circuit, the rate of the electric current flowing to each of the transistors may be shifted from a designated rate.

SUMMARY OF THE INVENTION

Accordingly, embodiments of the present invention may provide a novel and useful semiconductor device solving one or more of the problems discussed above.

More specifically, the embodiments of the present invention may provide a semiconductor device including a current mirror circuit, whereby it is possible to prevent the rate of the electric current flowing to each of the transistors from being shifted from a designated rate.

Another aspect of the present invention may be to provide a semiconductor device, including a semiconductor element including a current mirror circuit; a parasitic resistance formed at the current mirror circuit; and a connection terminal electrically connected to a part of the current mirror circuit via an electric conductor including a bonding wire, the connection terminal being configured to perform input and output relative to an outside of the semiconductor device; wherein a resistance value of the bonding wire is controlled so that a shift of an output electric current of the current mirror circuit based on the parasitic resistance is corrected.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 6 is a view showing an example of a layout of the current mirror circuit included in the semiconductor device of the second embodiment of the present invention.

DETAILED DESCRIPTION OF THE PREFERRED EMBODIMENTS

A description is given below, with reference to the FIG. 1 through FIG. 6 of embodiments of the present invention.

First Embodiment

Figure 1:
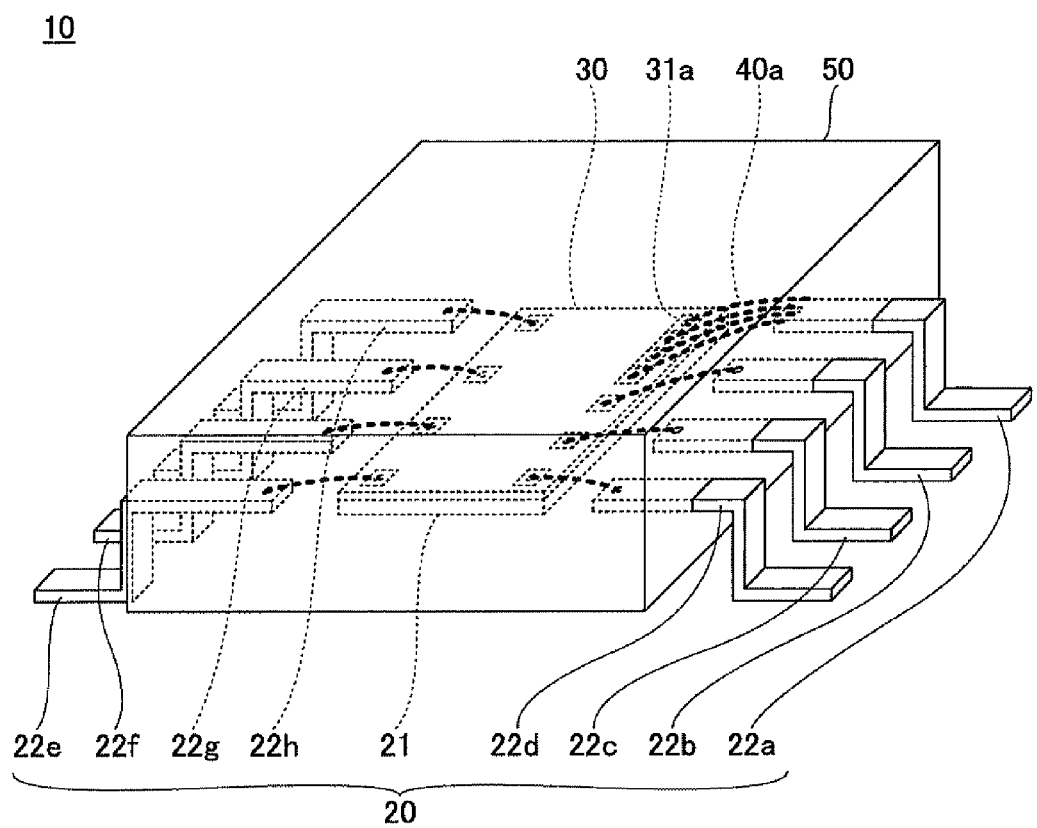
FIG. 1 is a perspective view of a semiconductor device of a first embodiment of the present invention.
Figure 2:
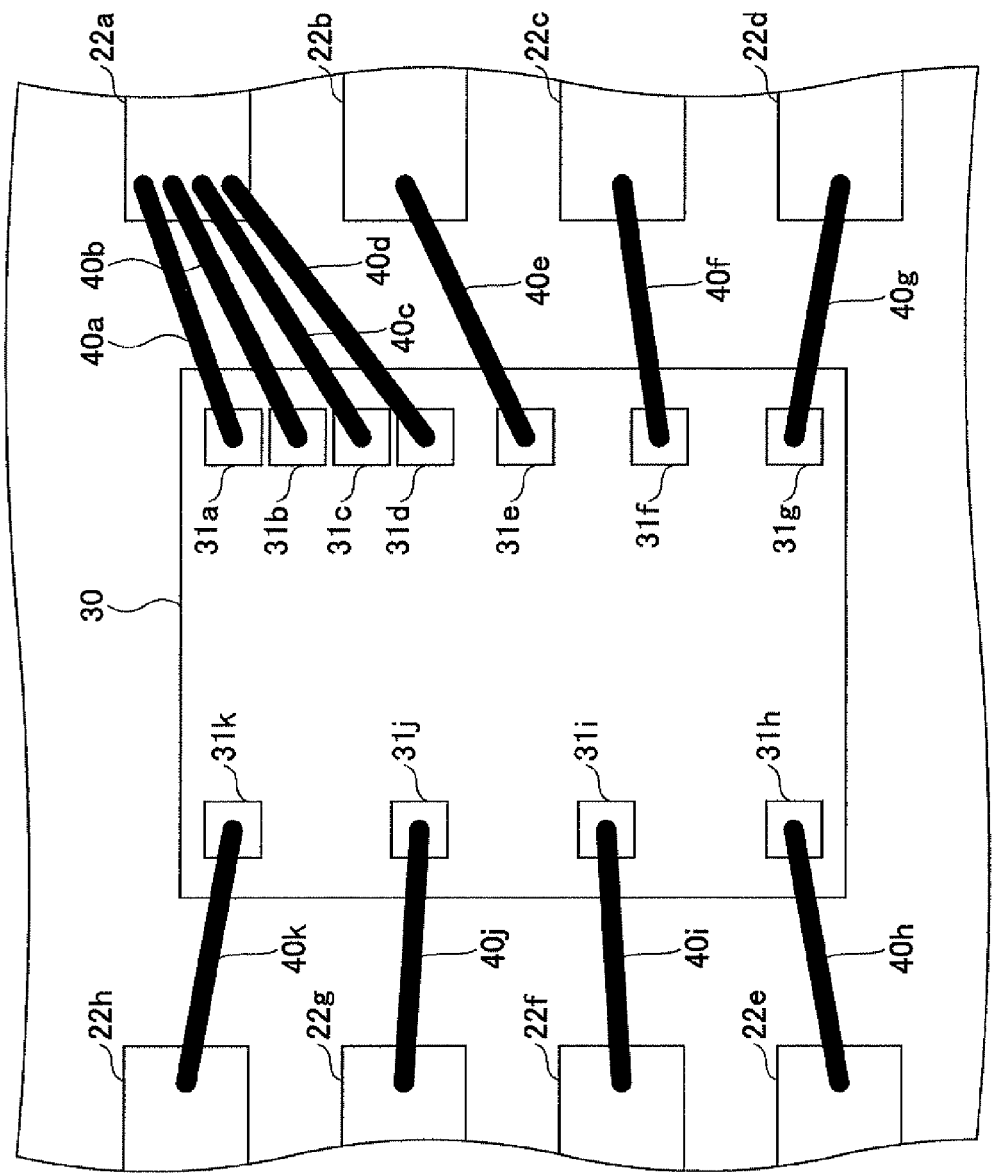
FIG. 2 is a partial schematic view showing an inside of the semiconductor device of the first embodiment of the present invention.

FIG. 1 is a perspective view of a semiconductor device of a first embodiment of the present invention. FIG. 2 is a partial schematic view showing an inside of the semiconductor device of the first embodiment of the present invention. Referring to FIG. 1 and FIG. 2, a semiconductor device 10 includes a lead frame 20, a semiconductor element 30, bonding wires 40a through 40k and a sealing part 50.

In the semiconductor device 10, the lead frame 20 includes an island part 21 and lead parts 22a through 22h situated outside the island part 21. The lead frame 20 is formed by forming a metal layer on a surface of a metal body. The metal body is made of, for example, Cu, Cu alloy, or the like. The metal layer is made of, for example, Au, Sn, Sn—Ag, or the like. The semiconductor element 30 is adhered on an upper surface of the island part 21 of the lead frame 20 by adhesive or the like (not illustrated in FIG. 1).

The semiconductor element 30 is formed by forming a semiconductor integrated circuit (not illustrated in FIG. 1) including a transistor or the like formed on a semiconductor substrate (not illustrated in FIG. 1). The semiconductor element 30 includes a current mirror circuit 11 discussed below. The semiconductor integrated circuit (not illustrated in FIG. 1) includes, for example, a diffusion layer (not illustrated in FIG. 1), an insulation layer (not illustrated in FIG. 1), a via-hole (not illustrated in FIG. 1), a wiring (not illustrated in FIG. 1), and other parts. The semiconductor element 30 includes plural electrode pads 31a through 31k which are electrically connected to the semiconductor integrated circuit (not illustrated in FIG. 1). As materials of the electrode pads 31a through 31k, for example, Al can be used. However, there is no limitation to the materials of the electrode pads 31a through 31k. As the materials of the electrode pads 31a through 31k, other materials where an Al layer is formed on a Cu layer may be used.

The bonding wires 40a through 40k electrically connect the electrode pads 31a through 31k of the semiconductor element 30 to corresponding lead parts 22a through 22h. As materials of the bonding wires 40a through 40k, for example, Au can be used. However, there is no limitation to the materials of the bonding wires 40a through 40k. As the materials of the bonding wires 40a through 40k, other materials such as an alloy including Au, Al, an alloy including Al, Cu, or an alloy including Cu may be used.

The lead frame 20, the semiconductor element 30, and the bonding wires 40a through 40k are sealed by the sealing part 50 so that portions of the lead parts 22a through 22h of the lead frame 20 are exposed. Epoxy group thermosetting resin, for example, can be used as a material of the sealing part 50. Portions of the lead parts 22a through 22h of the lead frame 20 sealed by the sealing part 50 may be called inner leads. Portions of the lead parts 22a through 22h of the lead frame 20 which are exposed may be called outer leads. The outer lead functions as an outside connection terminal configured to electrically connect the semiconductor device 10 to a wiring board or the like situated outside the semiconductor device 10. Thus, the lead parts 22a through 22h are electrically connected to the semiconductor element 30 by electric conductors including the bonding wires 40a through 40k. The lead parts 22a through 22h are connection terminals configured to input or output signals to or from the outside of the semiconductor device 10.

Figure 3:
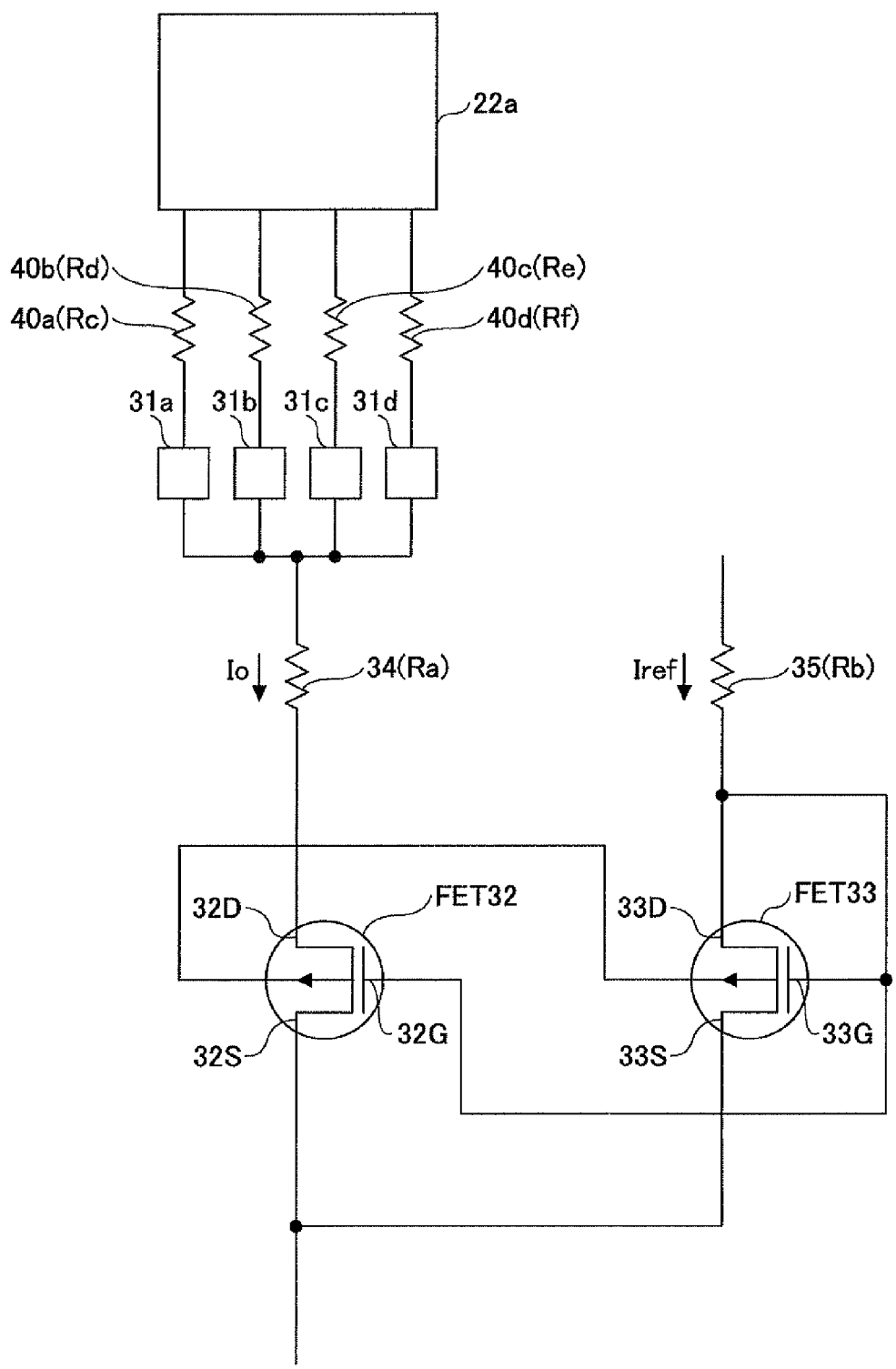
FIG. 3 is a circuit diagram of a current mirror circuit included in the semiconductor device of the first embodiment of the present invention.

FIG. 3 is a circuit diagram of a current mirror circuit included in the semiconductor device of the first embodiment of the present invention. Referring to FIG. 3, a current mirror circuit 11 is included in the semiconductor element 30 of the semiconductor device 10. The current mirror circuit 11 includes an FET 32 and FETs 33. N (n=natural number) of the FETs 33 are connected, in parallel, to the FET 32; "n" may be, for example, approximately 500. In FIG. 3, "Iref" denotes a reference current and "Io" denotes an output current.

A drain 32D of the FET 32 is connected to the electrode pads 31a through 31d via a metal wiring 34 such as Al. As shown in FIG. 2, the electrode pads 31a through 31d are connected to the lead part 22a via the bonding wires 40a through 40d. A source 32S of the FET 32 is connected to a source 33S of the FET 33 and further connected to an inside circuit (not illustrated in FIG. 3) via a metal wiring such as Al. A gate 32G of the FET 32 is connected to a drain 33D and a gate 33G of the FET 33 and further connected to an inside circuit (not illustrated in FIG. 3) via a metal wiring 35 such as Al. "Ra" and "Rb" denote parasitic resistances of the metal wirings 34 and 35, respectively, such as Al. "Rc" through "Rf" denote respective resistances of the bonding wires 40a through 40d. Although the lead part 22a also has resistance, the resistance of the lead part 22a is sufficiently smaller than the parasitic resistances of the metal wirings 34 and 35 and the resistances of the bonding wires 40a through 40d and therefore can be disregarded.

Figure 4:
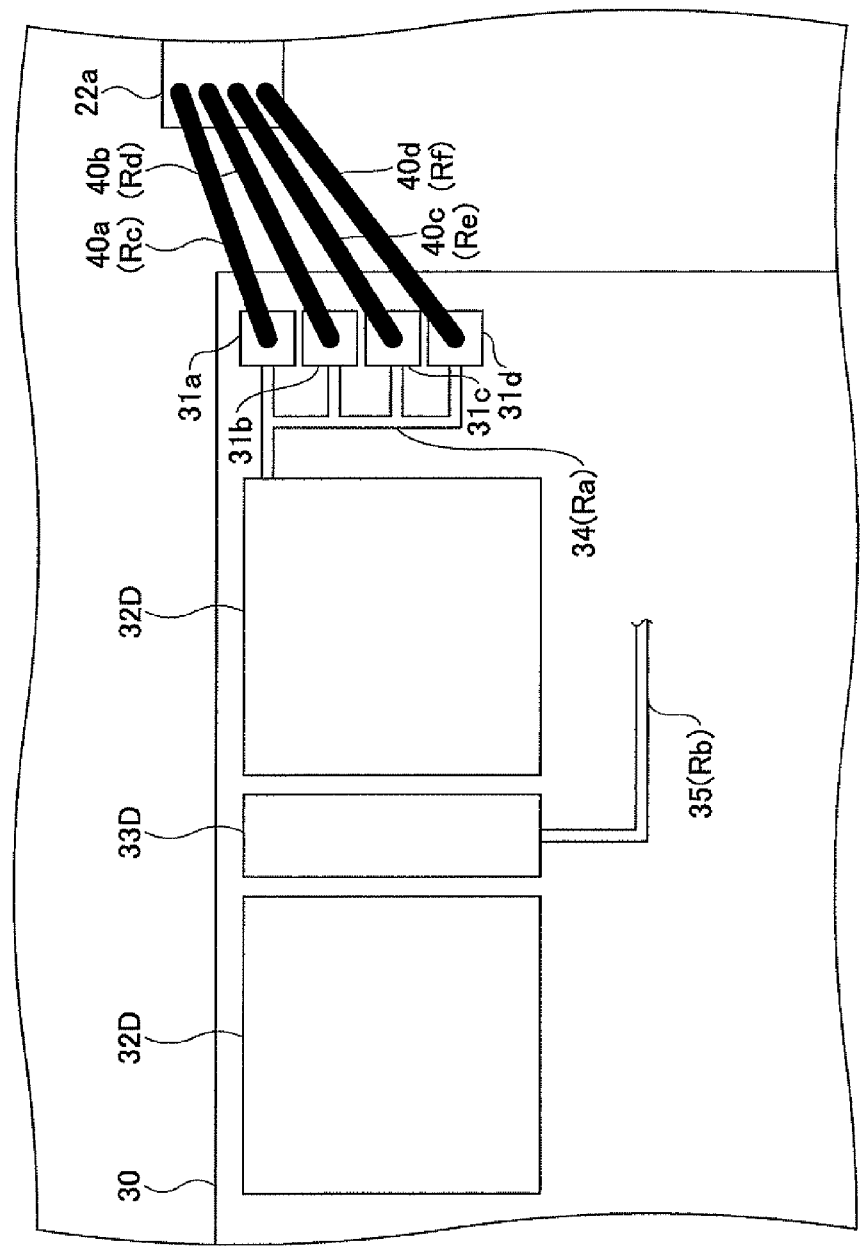
FIG. 4 is a view showing an example of a layout of the current mirror circuit included in the semiconductor device of the first embodiment of the present invention.

FIG. 4 is a view showing an example of a layout of the current mirror circuit 11 included in the semiconductor device 30 of the first embodiment of the present invention. In FIG. 4, only the drain 32D of the FET 32, the drain 33D of the FET 33, the metal wirings 34 and 35, the electrode pads 31a through 31d, the bonding wires 40a through 40d and the lead part 22a are illustrated. Illustrations of the source 32S of the FET 32 and other parts are omitted in FIG. 4. Although the drains 32O of the FET 32 are laid out at both sides of the drain 33O of the FET 33, the layout is not limited to this example.

It is ideal that, in the current mirror circuit 11 shown in FIG. 3 and FIG. 4, the parasitic resistances of the metal wirings 34 and 35 have zero Ω (ohms). A number n (n=natural number) of the FETs 33 are connected, in parallel, to the FET 32. Accordingly, if the parasitic resistances of the metal wirings 34 and 35 have zero Q, the following formula 1 holds true.

$$Io = n \times Iref \qquad \text{(Numerical Formula 1)}$$

However, actually the parasitic resistances Ra and Rb are not zero Ω, the numerical formula 1 does not hold true and therefore a desirable electric current value Io cannot be obtained.

In order to satisfy the above-mentioned numerical formula 1, it is necessary for the resistance value of the parasitic resistance Ra connected to the drain 32O of the FET 32 to be 1/n of the resistance value of the parasitic resistance Rb connected to the drain 33D of the FET 33. In order to realize this, arrangement of the metal wirings 34 and 35 may be controlled. However, since there is limitation of the arrangement of the metal wirings 34 and 35 in terms of the layout, it may be difficult to realize this.

Because of this, in the embodiments of the present invention, resistances of not only the metal wirings 34 and 35 but also the metal wirings 34 and 35 and the bonding wires 40a-40d are considered. In other words, by changing the number, the diameter, the length and/or a material of the bonding wires 40a-40d, shift of an output electric current Io of the current mirror circuit 11 due to the parasitic resistances Ra and Rb is corrected. With this structure, even if the parasitic resistances Ra and Rb are not zero Ω, the numerical formula 1 is satisfied so that a desirable electric current value is obtained. In the example shown in FIG. 3 and FIG. 4, four electrode pads 31a through 31d connected to the drain 32D of the FET 32 via the metal wiring 34 are provided. The electrode pads 31a through 31d and the lead part 22a are connected to each other by the bonding wires 40a through 40d. The bonding wires 40a through 40d are connected in parallel.

As a result of this, the relationship between the sum of the resistance values of the resistance and the parasitic resistance connected to the drain 32D of the FET 32, namely "Ra+Rc//Rd//Re//Rf" (parasitic resistance Ra plus the equivalent resistance of parallel resistances Rc, Rd, Re and Rf), and a resistance value "Rb" of the parasitic resistance connected to the drain 33D of the FET 33 can be expressed by the following numerical formula 2.

$$Ra + Rc//Rd//Re//Rf = 1/n \times Rb \qquad \text{(Numerical Formula 2)}$$

Not only the number of the bonding wires 40a through 40k but also the diameter, length, or material of the bonding wires 40a through 40k may be controlled.

Even if the number of the bonding wires is four (bonding wires 40a through 40d), the above-mentioned numerical formula 2 does not always hold true. In this embodiment, by changing the number, diameter, length or material of the bonding wires so that the above-mentioned formula 2 is satisfied, the resistance value of the bonding wires is controlled so as to be a value where the shift of the output electric current Io of the current mirror circuit 11 due to the parasitic resistances Ra and Rb is corrected. In order to satisfy the numerical formula 2 by controlling the resistances Re through Rf of the bonding wires 40a through 40d, the parasitic resistance Ra should be set in advance so as to be sufficiently smaller than the parasitic resistance Rb.

According to the first embodiment of the present invention, in the semiconductor device 10 including the current mirror circuit 11 having the FET 33 and FET 32 where n (n=natural number) of the FETs 33 are connected in parallel, by controlling the number, diameter, length or material of the bonding wires 40a through 40d, the sum of the resistance values of the resistance and the parasitic resistance connected to the drain 32D of the FET 32 should be 1/n of the resistance value of the parasitic resistance connected to the drain 33D of the FET 33. As a result of this, it is possible to prevent generation of shift of the electric current value due to the parasitic resistance and therefore the desirable electric current value Io=n×Iref can be obtained.

Second Embodiment

Figure 5:
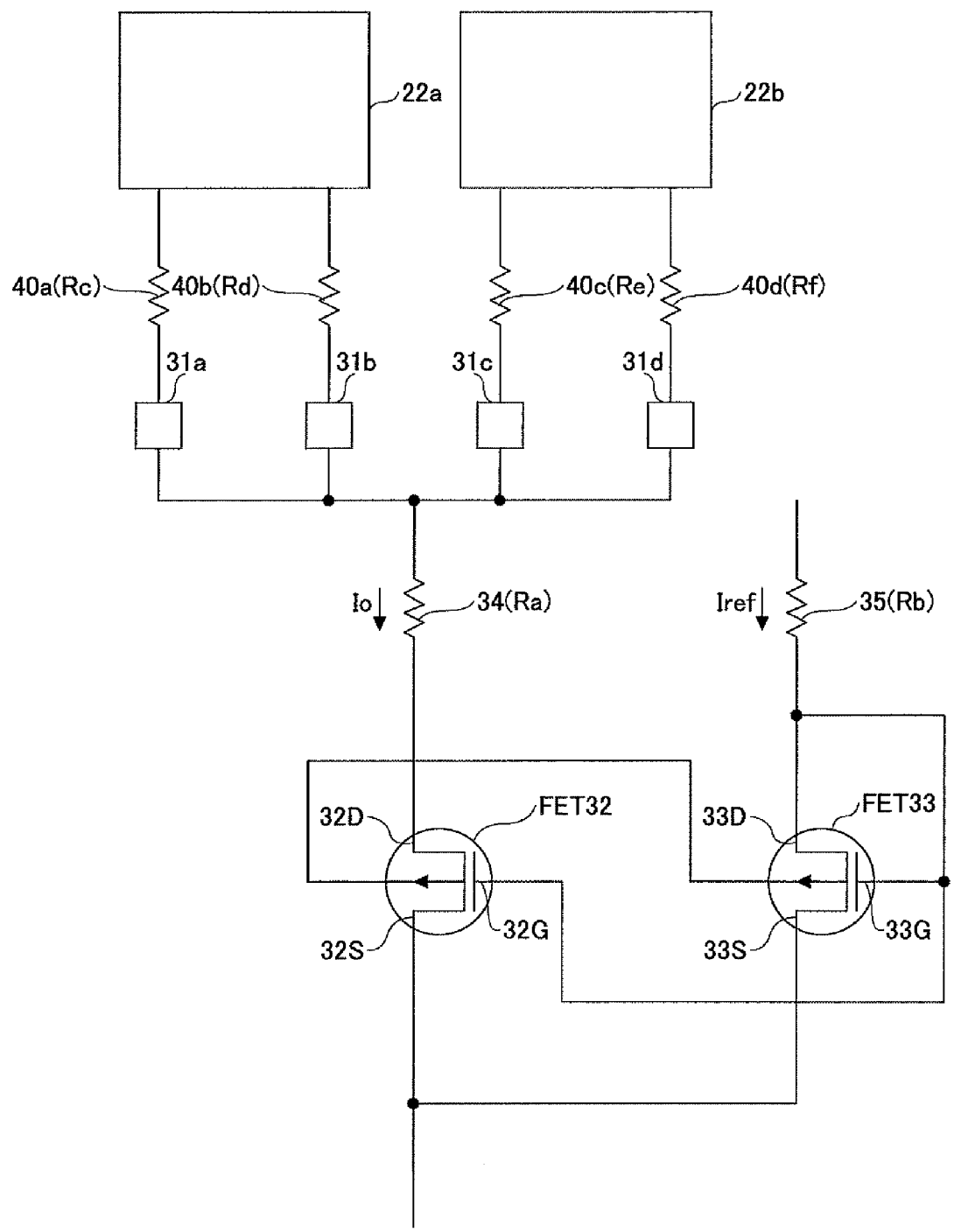
FIG. 5 is a circuit diagram of a current mirror circuit included in a semiconductor device of a second embodiment of the present invention.

FIG. 5 is a circuit diagram of a current mirror circuit included in a semiconductor device of a second embodiment of the present invention. FIG. 6 is a view showing an example of a layout of the current mirror circuit included in the semiconductor device of the second embodiment of the present invention. In FIG. 5 and FIG. 6, parts that are the same as the parts shown in FIG. 3 and FIG. 4 are given the same reference numerals, and explanation thereof is omitted.

As shown in FIG. 5 and FIG. 6, in a current mirror circuit 12 included in a semiconductor device 10A of the second embodiment of the present invention, the electrode pads 31a and 31b are connected to the lead part 22a via the bonding wires 40a and 40b. In addition, the electrode pads 31c and 31d are connected to the lead part 22b via the bonding wires 40c and 40d. Structures of other parts of the current mirror circuit 12 included in the semiconductor device 10A of the second embodiment of the present invention are the same as those of the current mirror circuit 11 included in the semiconductor device 10 of the first embodiment of the present invention. Hence, in the following description, only parts of the current mirror circuit 12 different from the current mirror circuit 11 are discussed.

In the current mirror circuit 12 shown in FIG. 5 and FIG. 6, the four electrode pads 31a through 31d connected to the drain 32D of the FET 32 via the metal wiring 34 are provided. The electrode pads 31a and 31b and the lead part 22a are connected to each other by the bonding wires 40a and 40b. The electrode pads 31c and 31d and the lead part 22b are connected to each other by the bonding wires 40c and 40d. As discussed above, the parts (outer lead) of the lead parts 22a through 22h are exposed from the sealing part 50 and function as outside connection terminals for electrically connecting to the wiring board or the like provided outside the semiconductor device 10A. The current mirror circuit 12 included in the semiconductor device 10A of the second embodiment of the present invention is designed based on the assumption that the lead parts 22a and 22b exposed from the sealing part 50 are short-circuited by the wiring pattern of the wiring board or the like when the semiconductor device 10A is mounted on the wiring board or the like.

The lead parts 22a and 22b are short-circuited by the wiring pattern of the wiring board or the like so that the bonding wires 40a through 40d are connected in parallel.

As a result of this, the relationship between the sum of the resistance values of the resistance and the parasitic resistance connected to the drain 32D of the FET 32, namely "Re+Rc//Rd//Re//Rf", and a resistance value "Rb" of the parasitic resistance connected to the drain 33D of the FET 33 can be expressed by the following numerical formula 2.

$$Ra+Rc//Rd//Re//Rf=1/n \times Rb \quad \text{(Numerical Formula 2)}$$

Not only the number of the bonding wires 40a through 40k but also the diameter, length, or material of the bonding wires 40a through 40k may be controlled.

Even if the number of the bonding wires is four (bonding wires 40a through 40d), the above-mentioned numerical formula 2 does not always hold true. In this embodiment, by changing the number, diameter, length or material of the bonding wire so that the above-mentioned formula 2 is satisfied, the resistance value of the bonding wire is controlled so as to be a value where the shift of the output electric current Io of the current mirror circuit 11 due to the parasitic resistances Ra and Rb is corrected. In order to satisfy the numerical formula 2 by controlling the resistances Rc through Rf of the bonding wires 40a through 40d, the parasitic resistance Ra should be set in advance so as to be sufficiently smaller than the parasitic resistance Rb.

According to the second embodiment of the present invention, in the semiconductor device 10A including the current mirror circuit 12 having the FET 33 and FET 32 where n (n=natural number) of the FETs 33 are connected in parallel, the bonding wires 40a and 40b are connected to the lead part 22a and the bonding wires 40c and 40d are connected to the lead part 22b based on the assumption that the lead parts 22a and 22b exposed from the sealing part 50 are short-circuited. In addition, by controlling the number, diameter, length or material of the bonding wires 40a through 40d, the sum of the resistance values of the resistance and the parasitic resistance connected to the drain 32D of the FET 32 should be 1/n of the resistance value of the parasitic resistance connected to the drain 33D of the FET 33. As a result of this, it is possible to prevent generation of a shift of the electric current value due to the parasitic resistance and therefore the desirable electric current value Io=n×Iref can be obtained.

According to the embodiments of the present invention, it is possible to provide a semiconductor device (10), including a semiconductor element (30) including a current mirror circuit (11, 12); a parasitic resistance (Re, Rb) formed at the current mirror circuit (11, 12); and a connection terminal (20a, 20b) electrically connected to a part of the current mirror circuit (11, 12) via an electric conductor including a bonding wire (40a through 40d), the connection terminal (20a, 20b) being configured to perform input and output relative to an outside the semiconductor device (10); wherein a resistance value (Rc through Rf) of the bonding wire (40a through 40d) is controlled so that a shift of an output electric current (Io) of the current mirror circuit (11, 12) based on the parasitic resistance (Ra, Rb) is corrected. It should be noted that the numerical references indicated in the immediately above sentence are indicated just for easy understanding and the present invention is not limited to the examples shown in drawings.

Thus, according to the embodiments of the present invention, it is possible to provide a semiconductor device including a current mirror, whereby it is possible to prevent the rate of the electric current flowing to each of the transistors from being shifted from a designated rate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

For example, in the first embodiment of the present invention, the resistance of the lead part 22a is not considered. However, the resistance of the lead part 22a may be included in the numerical formula 2 in a case where the resistance of the lead part 22a has a value which cannot be disregarded compared to the parasitic resistances of the metal wirings 34 and 35 and the resistances of the bonding wires 40*a* through 40*d*.

In addition, in the second embodiment of the present invention, two bonding wires are connected to each of the lead parts 22*a* and 20*b*. The number of the electrode pads and the bonding wires may be changed if necessary such that three bonding wires are connected to the lead part 22*a* and four bonding wires are connected to the lead part 22*b*.

Furthermore, in the second embodiment of the present invention, when the semiconductor device 10A is mounted on the wiring board or the like, the lead parts 22*a* and 20*b* are short-circuited by the wiring pattern of the wiring board or the like. However, there is no limitation to the lead parts 22*a* and 20*b*. Three or more lead parts may be short-circuited.

In addition, in the first embodiment and the second embodiment of the present invention, the semiconductor device including the current mirror circuit using a P channel FET is discussed. However, the present invention is not limited to this type of the semiconductor device. For example, the present invention can be applied to a semiconductor device including a current mirror circuit using an N channel FET. In addition, for example, the present invention can be applied to a semiconductor device including a current mirror circuit using an NPN type bipolar transistor or a PNP type bipolar transistor.

What is claimed is:

1. A semiconductor device, comprising:
    a semiconductor element including a current mirror circuit which includes two transistors;
    a first parasitic resistance formed at a first drain of the two transistors and a second parasitic resistance formed at a second drain of the two transistors; and
    a connection terminal electrically connected to the first drain via an electric conductor including a plurality of bonding wires, the connection terminal being configured to perform input and output relative to an outside of the semiconductor device,
    wherein resistance values of the plurality of bonding wires are controlled so that a shift of an output electric current of the current mirror circuit caused by a difference between values of the first parasitic resistance and the second parasitic resistance is corrected by satisfying a relationship of $Ra+Rc1//Rc2// \ldots //RcN=Rb/n$,
    where Ra designates the value of the first parasitic resistance, Rb designates the value of the second parasitic resistance, RcN designate resistance values of the plurality of bonding wires (N Is a natural number of 2 or more, and n Is a natural number).

2. The semiconductor device as claimed in claim 1, wherein
    at least the number, diameters, lengths, or materials of the plurality of bonding wires are controlled to determine the resistance values so as to satisfy the relationship.

3. The semiconductor device as claimed in claim 1, wherein
    the value (Ra) of the first parasitic resistance is smaller than the value (Rb) of the second parasitic resistance.

* * * * *